United States Patent [19]

May et al.

[11] Patent Number: 4,947,126

[45] Date of Patent: Aug. 7, 1990

[54] GROUND FAULT CURRENT RECTIFICATION AND MEASURING CIRCUIT

[75] Inventors: William E. May, Lawrenceville; William A. King, Lithonia; Jerry M. Green, Dunwoody, all of Ga.

[73] Assignee: Siemens Energy & Automation, Inc., Alpharetta, Ga.

[21] Appl. No.: 333,208

[22] Filed: Apr. 4, 1989

[51] Int. Cl.$^5$ ............................................. G01R 31/14
[52] U.S. Cl. ..................... 324/509; 307/321; 324/522; 324/119; 363/126
[58] Field of Search ............... 324/509, 510, 522, 525, 324/119, 107; 363/126; 361/48, 47, 49, 50, 93; 307/321

[56] References Cited

U.S. PATENT DOCUMENTS

| | | | |
|---|---|---|---|
| 3,887,867 | 6/1975 | Safer et al. | 324/524 X |
| 4,121,269 | 10/1978 | Hobson, Jr. | 361/47 X |
| 4,234,900 | 11/1980 | Miyazaki et al. | 324/509 X |
| 4,631,625 | 12/1986 | Alexander et al. | 361/94 |
| 4,758,919 | 7/1988 | Stewart | 361/93 X |
| 4,761,704 | 8/1988 | Fraisse et al. | 324/509 X |

*Primary Examiner*—Reinhard J. Eisenzopf
*Assistant Examiner*—Robert W. Mueller
*Attorney, Agent, or Firm*—James G. Morrow; Peter A. Luccarelli, Jr.

[57] ABSTRACT

An apparatus for monitoring alternating currents and providing a signal representative of the current. The signals are rectified by a modified full wave rectifier to provide a power source, a positive signal associated with the positive range of the current, and a positive signal associated with the negative range of the current. The two positive signals serve to preserve the polarity information associated with the current being monitored. The apparatus also provides for combining the negative signals to produce other signals useable by a microprocessor and an analog logic circuit.

19 Claims, 4 Drawing Sheets

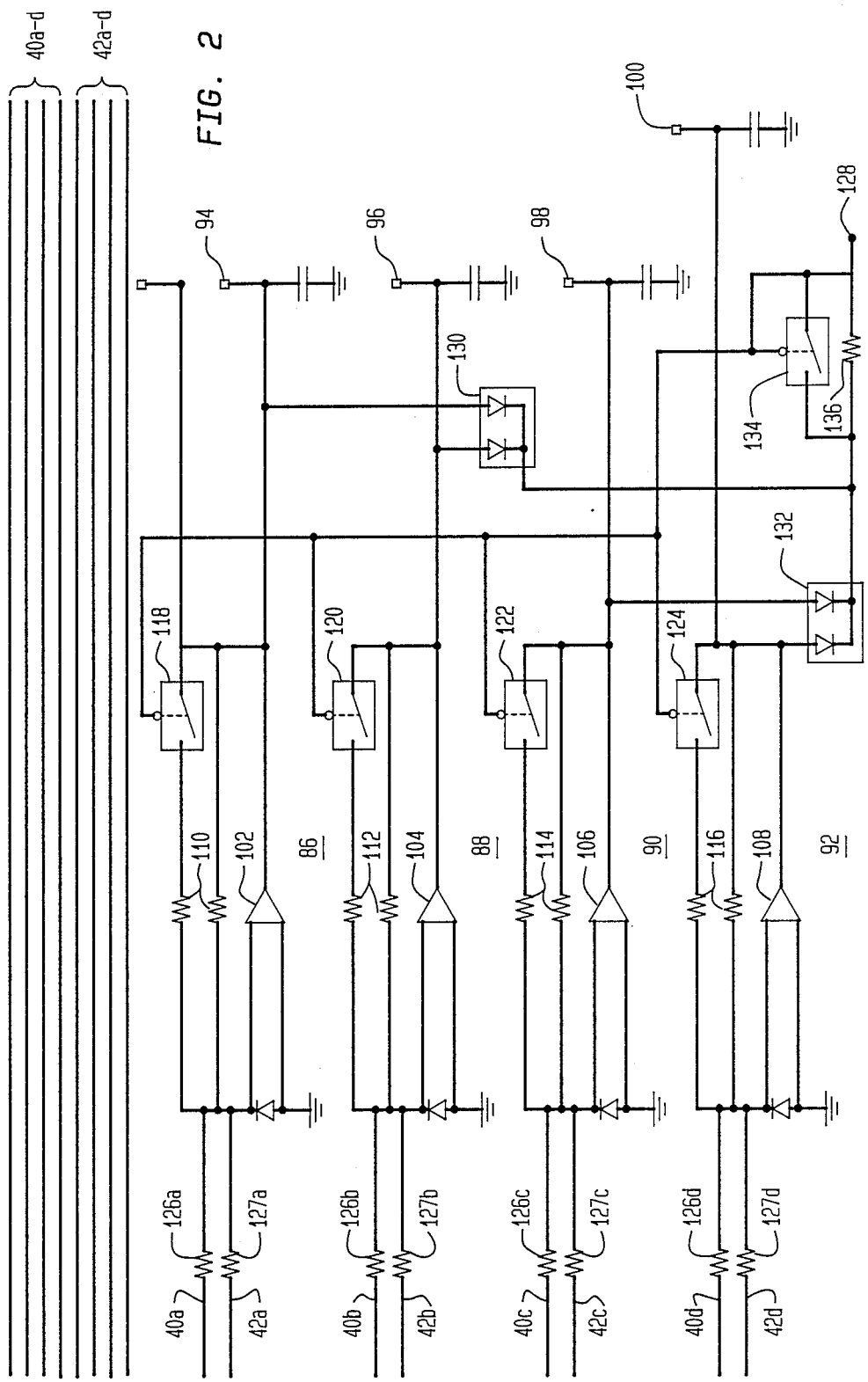

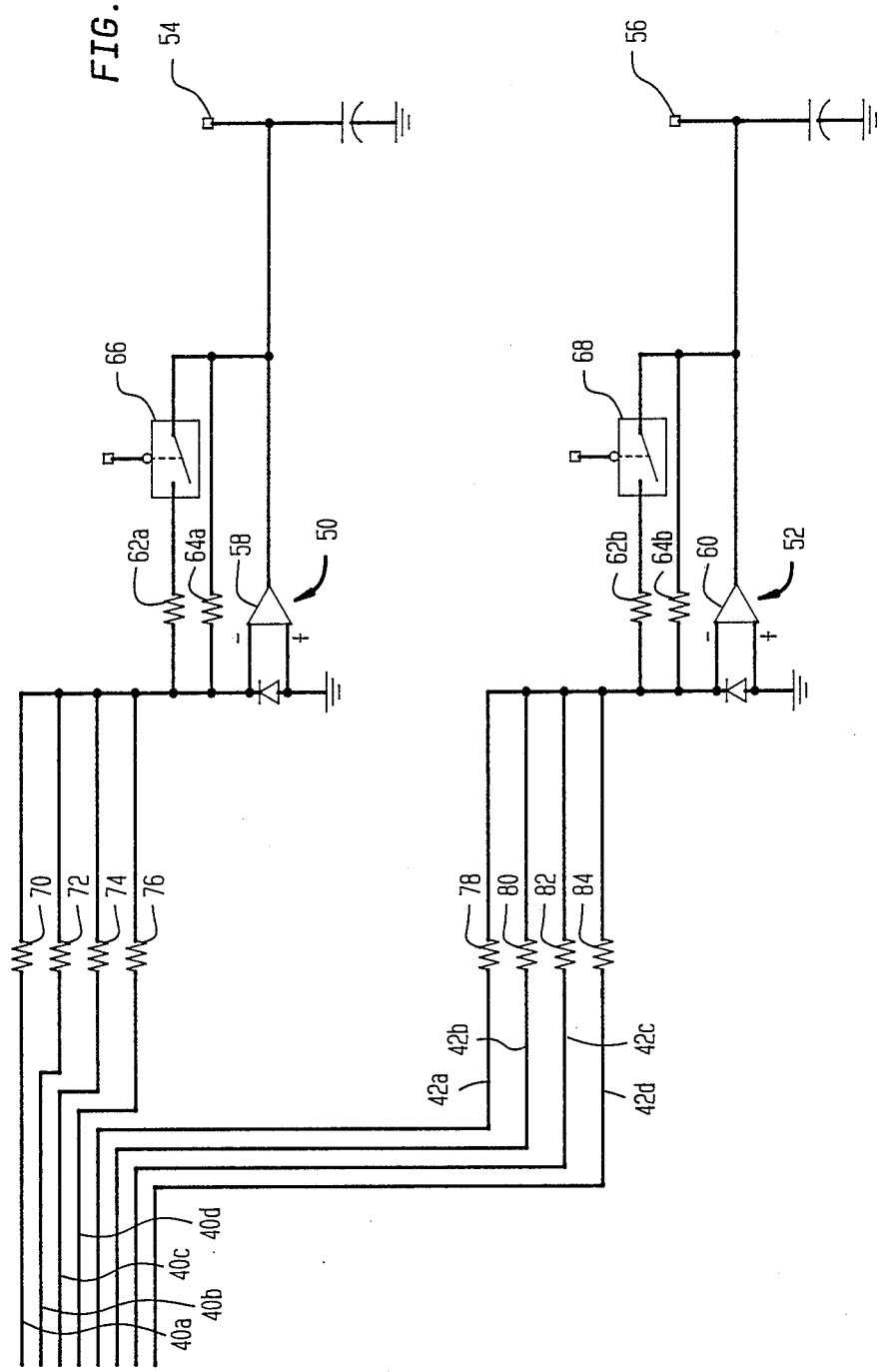

phrase by 120°.

GROUND FAULT CURRENT RECTIFICATION AND MEASURING CIRCUIT

BACKGROUND OF THE INVENTION

The present invention relates to current measurement, and, in particular, to an improved current measuring circuit which retains the polarity information of a signal representative of the current being measured after full wave rectification of the signal.

Current measuring circuits have many applications, and in particular, one such application is in a trip unit for a circuit breaker. U.S. Pat. No. 4,631,625, issued on Dec. 23, 1986, discloses a microprocessor based trip unit for a circuit breaker within which a current measuring device is incorporated. In FIG. 1 of U.S. Pat. No. 4,631,625 the current measuring device is generally illustrated as including current transformers 30-33, a rectifier 34, signal converters 34 and an analog invertor 37. The microcomputer of U.S. Pat. No. 4,631,625 ultimately utilizes the signals from the analog invertor 37 to calculate a ground fault current.

Some prior art ground fault protection schemes modify signals representative of the current being measured in such a way that the polarity information of these signals is not preserved. An RMS analysis of these signals can then be performed without the polarity information to calculate a ground fault current.

SUMMARY OF THE INVENTION

An object of the present invention is to provide a means for rectifying signals while also preserving the polarity information of these signals.

Accordingly, the present invention provides for an apparatus for producing a rectified signal corresponding to a current, wherein the current alternates between a first voltage range and a second voltage range. The apparatus includes means for producing a first signal representative of the alternating current; and means for rectifying the first signal such that a second signal is produced when the current is in the first voltage range and a third signal is produced when the current is in the second voltage range.

An advantage of the present invention is that it can be readily adapted for use in circuits for monitoring ground fault currents. Another advantage of the present invention is that it provides a means for retaining information which improves the accuracy of ground fault current calculations.

An embodiment of the invention is explained below in further detail with reference to the accompanying drawings.

BRIEF DESCRIPTION OF THE DRAWINGS

FIG. 2 is a schematic illustration of a circuit for summing and amplifying;

FIG. 3 is a schematic illustration of a circuit for summing and amplifying; and

FIG. 4 illustrates the manner in which the circuits of FIGS. 1-3 are coupled.

DETAILED DESCRIPTION OF THE PREFERRED EMBODIMENT

Figure 1:
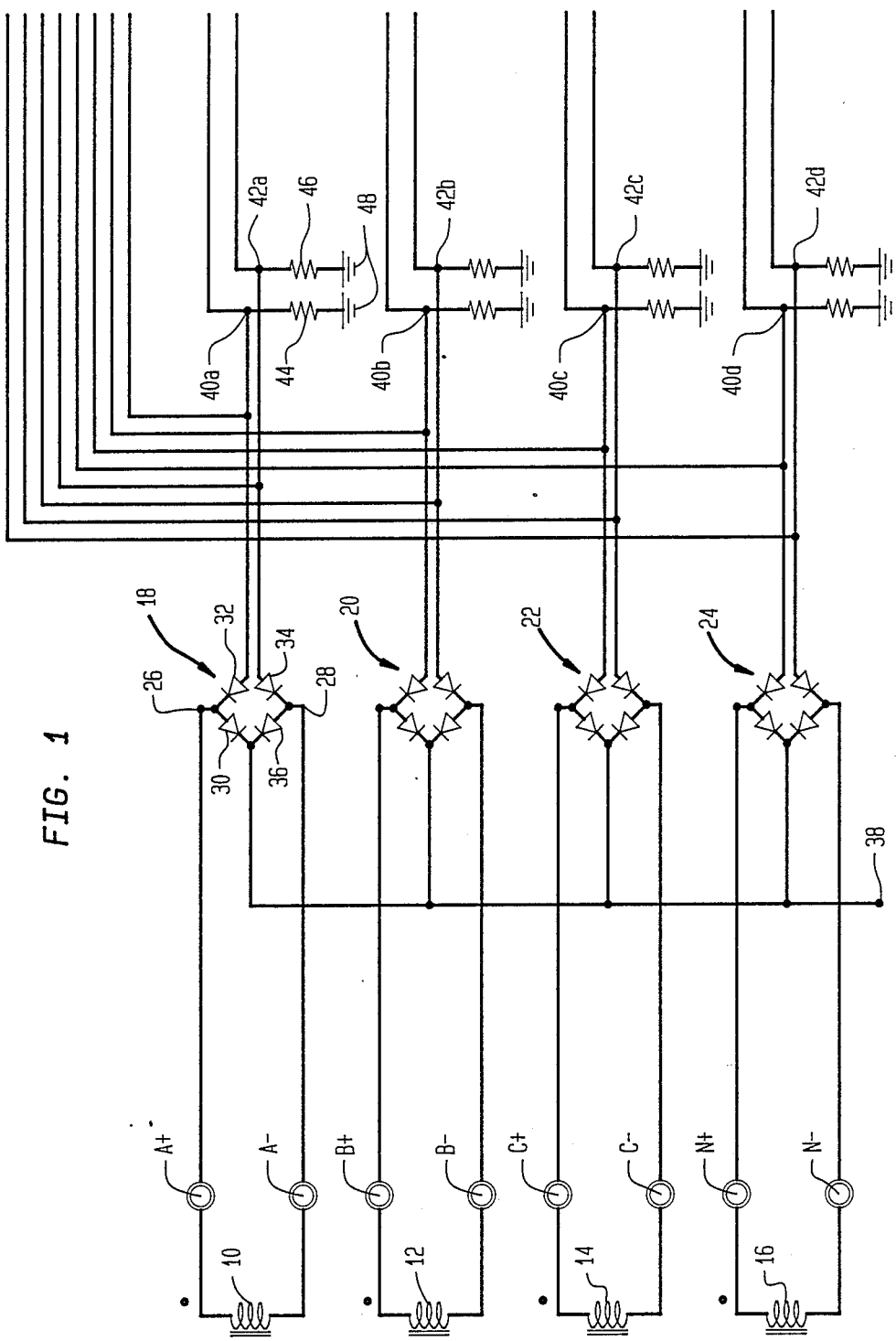
FIG. 1 is a schematic illustration of a circuit for providing signals representative of the load currents and the associated neutral current.

Referring now to the Figures, FIG. 1 illustrates a circuit for providing signals representative of the load currents in three phases (A, B, and C) and their associated neutral (N). The circuit also provides full wave rectification for these signals. In the preferred embodiment, current transformers 10, 12, 14, 16 are used to provide signals representative of the currents in lines A, B, C and N. By way of example, these currents can be currents alternating between a positive voltage range and a negative voltage range at a frequency of 60 cycles per second. In addition, the currents in lines A, B, and C can be out of phase by 120°.

Figure 1A:
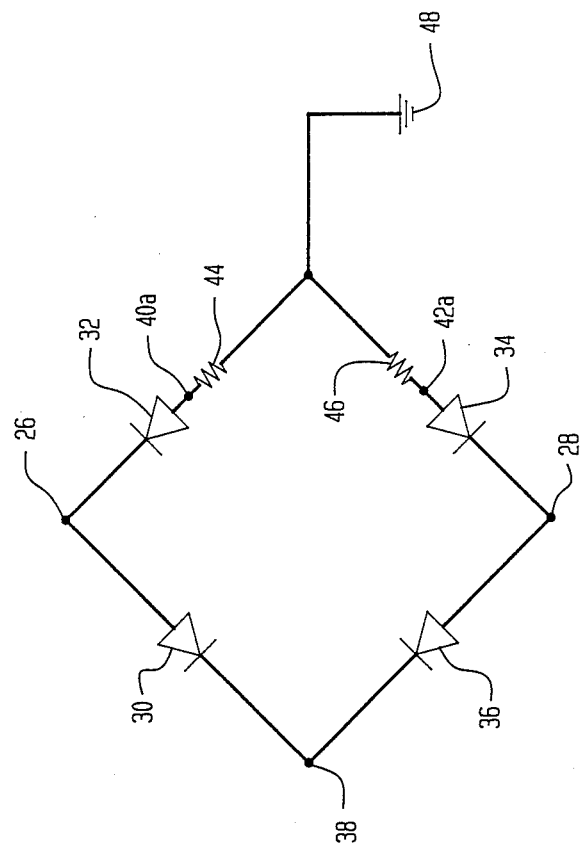
FIG. 1a is a schematic illustration of one modified full wave rectifier.

The signals from each of the current transformers 10, 12, 14, 16 are supplied to, and each rectified, in a respective modified full wave rectifier 18, 20, 22, 24. FIG. 1a illustrates one of the modified full wave rectifiers 18 which is exemplary of each rectifier 18, 20, 22, 24. The signal from a current transformer is supplied to the input terminals 26, 28 of the rectifier. The signal then undergoes a full wave rectification provided by the four diodes 30, 32, 34, 36 to provide a power source at a supply terminal 38, a first signal at a first signal terminal 40a, and a second signal at a second signal terminal 42a.

The terminal 40a is located at the junction between the series connected diode 32 and a resistor 44, and the terminal 42a is located at the junction between the series connected diode 34 and a resistor 46. The resistors 44, 46 are located between a reference voltage 48 and their respective terminals 40a, 42a. Accordingly, when a signal from a current transformer is in its positive voltage range and produces a positive potential at terminal 26, a positive signal representative of the positive voltage range is produced at the terminal 40a. Conversely, when a signal from a current transformer is in its negative voltage range and produces a positive potential at terminal 28, a positive signal representative of the negative voltage range is produced at the terminal 42a. These positive signals from the terminals 40a, 42a of the modified full wave rectifiers 18, 20, 22, 24 are supplied to the circuitry of FIGS. 2 and 3.

Referring now to FIG. 3, FIG. 3 illustrates two amplifiers 50, 52 for summing and amplifying the negative signals from the terminals 40a-d (FIG. 1) before they reach a sampling terminal 54, and summing and amplifying the positive signals from the terminals 42a-d before they reach a sampling terminal 56. The signals provided at terminals 54, 56 can then be supplied to a microprocessor for purposes of further analysis and decision making by the microprocessor.

Amplifiers 50, 52 each include a respective operational amplifier 58, 60, a respective pair of feedback resistors 62a-b, 64a-b, and a respective switch 66, 68. Each of the negative signals from the terminals 40a-d are coupled to the operational amplifier 58 through an input resistor 70, 72, 74, 76, and each of the positive signals from the terminals 42a-d are coupled to the operational amplifier 60 through an input resistor 78, 80, 82, 84. This arrangement sums and amplifies the group of negative signals associated with the positive voltage range of the signal from the current transformers 10, 12, 14, 16, and also sums and amplifies the group of negative signals associated with the negative voltage range of the signal from the current transformers 10, 12, 14, 16.

The respective pairs of feedback resistors 62a-b, 64a-b cooperate with switches 66, 68 to allow the gain of the amplifiers 50, 52 to be switched between two levels depending on the signal required at the sampling terminals 54, 56 for the microprocessor.

Referring now to FIG. 2, FIG. 2 illustrates four amplifiers 86, 88, 90, 92 for summing and amplifying the signals from the terminals 40a-d, 42a-d of each modified full wave rectifier 18, 20, 22, 24. The summation of these signals is then supplied to respective sampling terminals 94, 96, 98, 100 which can be coupled to a microprocessor which utilizes the signals for further analysis and decision making. The signals from the sampling terminals 94, 96, 98, 100 can also be supplied to and utilized by an analog circuit. (See discussion below.)

Amplifier 86, 88, 90, 92 each include a respective operational amplifier 102, 104, 106, 108, a respective pair of feedback resistors 110, 112, 114, 116, and a respective switch 118, 120, 122, 124. For each rectifier 18, 20, 22, 24, the negative signals from its terminals 40a-d, 42a-d are coupled to the respective operational amplifier 102, 104, 106, 108 through an input resistor 126a-d, 127a-d. This arrangement sums and amplifies the negative signals associated with the positive and negative voltage ranges of the signal from the current transformers 10, 12, 14, 16.

The respective pairs of feedback resistors 110, 112, 114, 116 coorporate switches 118, 120, 122, 124 to allow the gain of amplifiers 86, 88, 90, 92 to be switched between two levels depending on the signal required at the sampling terminals 94, 96, 98, 100 for the microprocessor and analog circuit.

In providing a signal to the sampling terminal 128, the four signals from the sampling terminals 94, 96, 98, 100 are combined through respective pairs of OR gates 130, 132 (FIG. 2) such that the resulting signal is the largest of the four signals applied to the gates 130, 132. The resulting signal is applied to a switch 134 and resistor 136 such that the signal is applied to the resistor 136 when the switches 118, 120, 122, 124, 134 are open and the gain of the amplifiers 86, 88, 90, 92 is at the highest of their two levels.

By way of example, the above-described circuit may be used in a trip unit for a circuit breaker. (A trip unit of this general type is disclosed in U.S. Pat. No. 4,631,625.) As previously discussed, signals from amplifiers 50, 52, 86, 88, 90, 92 can be supplied to the microprocessor of a trip unit. Based upon these signals, the microprocessor can supply a signal which causes the circuit breaker to trip. The signals from amplifiers 86, 88, 90, 92 can also be applied to an overriding analog comparator circuit wherein the largest of the signals is compared with a predetermined limit. When the signals fall outside of the predetermined limit the circuit causes the circuit breaker to trip. Under certain conditions such as a short circuit, the overriding analog circuit is necessary since many microprocessors are too slow to cause the circuit breaker to trip in time to prevent damage to the circuit being protected.

While one embodiment of a current measuring apparatus has been shown and described in detail herein, various other changes and modifications may be made to adapt the assembly for use in various articles. For example, the specific configuration of the circuit could be modified to function with more or less than three phases of current. The apparatus could also be used with devices other than circuit breaker trip units.

We claim:

1. An apparatus for producing a rectified signal corresponding to a current, the current alternating between a first voltage range and a second voltage range, the apparatus comprising:

means for producing a first signal representative of the alternating current; and means for rectifying the first signal to produce a power source, the means for rectifying including:

a series connection of a first rectifying element, a first impedance element, a second impedance element and a second rectifying element, wherein the first rectifying element is connected to the first impedance element at a first junction, the first impedance element is connected to the second impedance element at a reference junction, and the second impedance element is connected to the second rectifying element at a second junction;

the means for producing a first signal representative of the alternating current being connected to the first rectifying element at a first input terminal and the second rectifying element at a second input terminal such that a second signal is produced at the first junction when the potential of the first input terminal is higher than the potential of the reference junction and a third signal is produced at the second junction when the potential of the second input terminal is higher than the potential of the reference junction.

2. The apparatus of claim 1 further comprising means for amplifying the second signal and means for amplifying the third signal, wherein the means for amplifying are each adapted to amplify at a first gain level and a second gain level.

3. An apparatus for summing a first signal representative of a first current and a second signal representative of a second current, the currents alternating between a first voltage range and a second voltage range, the apparatus comprising:

(a) means for producing a first signal representative of the first current;

(b) means for producing a second signal representative of the second current;

(c) means for rectifying the first signal to produce a first power supply;

(d) means for rectifying the second signal to produce a second power supply;

the means for rectifying the second signal and the means for rectifying the first signal each including;

(i) a series connection of a first rectifying element, a first input terminal, a first impedance element, a second impedance element and a second rectifying element including a second input terminal, wherein the first rectifying element is connected to the first impedance element at a first junction, the first impedance element is connected to the second impedance element at a reference junction, and the second impedance element is connected to the second rectifying element at a second junction;

the means for producing a first signal being connected to the respective first rectifying element at the first input terminal and the respective second rectifying element at the second input terminal such that a third signal is produced at the first junction when the potential of the first input terminal is higher than the potential of the reference junction and a fourth signal is produced at the second junction when the potential of the second input terminal is higher than the potential of the reference junction, and the means for producing a second signal being connected to the respective first rectifying element at the first input terminal and the respective second rectifying element at the second input terminal such that a fifth signal is produced at the first junction when the potential of the first input terminal is higher than the potential of the reference junction and a sixth signal is produced at the second junction when the potential of the second input terminal is higher than the potential of the reference junction;

(e) means for summing the third signal and the fifth signal; and (f) means for summing the fourth signal and the sixth signal.

4. The apparatus of claim 3 further comprising means for amplifying the third and fifth signals and means for amplifying the fourth and sixth signals, wherein the means for amplifying are each adapted to amplify at a first gain level and a second gain level.

5. An apparatus for monitoring at least three phases of current and an associated neutral current, the currents alternating between a positive voltage and a negative voltage, the apparatus comprising:

means for producing a first signal representative of the first phase current, a second signal representative of the second phase current, a third signal representative of the third phase current, and a neutral signal representative of the neutral current;

first means for rectifying the first signal such that a fourth signal is produced when the first phase voltage is positive and a fifth signal is produced when the first phase voltage is negative, the first means including a first terminal and a second terminal, wherein the fourth signal is produced at the first terminal and excluded from the second terminal and the fifth signal is produced at the second terminal and excluded from the first terminal;

second means for rectifying the second signal such that a sixth signal is produced when the second phase voltage is positive and a seventh signal is produced when the second phase voltage is negative, the second means including a third terminal and a fourth terminal, wherein the sixth signal is produced at the third terminal and excluded from the fourth terminal and the seventh signal is produced at the fourth terminal and excluded from the third terminal;

third means for rectifying the third signal such that an eighth signal is produced when the third phase voltage is positive and a ninth signal is produced when the third phase voltage is negative, the third means including a fifth terminal and a sixth terminal, wherein the eighth signal is produced at the fifth terminal and excluded from the sixth terminal and the ninth signal is produced at the sixth terminal and excluded from the fifth terminal; and fourth means for rectifying the neutral signal such that a tenth signal is produced when the neutral voltage is positive and a eleventh signal is produced when the neutral phase voltage is negative, the fourth means including a seventh terminal and an eighth terminal, wherein the tenth signal is produced at the seventh terminal and excluded from the eighth terminal and the eleventh signal is produced at the eighth terminal and excluded from the seventh terminal;

means for summing the fourth, sixth, eighth, and tenth signals; and means for summing the fifth, seventh, ninth, and eleventh signals.

6. The apparatus of claim 5 wherein each means for rectifying comprises:

a first series connection for the respective signal including a first rectifying element and a first impedance means defining the respective terminal; and a second series connection for the respective signal including a second rectifying element and a second impedance means defining the respective terminal.

7. The apparatus of claim 6 wherein the means for rectifying each provide a power source.

8. The apparatus of claim 6 further comprising means for amplifying the fourth and fifth signals, means for amplifying the sixth and seventh signals, means for amplifying the eighth and ninth signals, and means for amplifying the tenth and eleventh signals, wherein each means is adapted to amplify at a first gain level and a second gain level.

9. A circuit for rectifying an AC signal, while generating indicia of the contemporaneous polarity of the AC signal, the circuit comprising:

first, second, third, and fourth diodes; and first and second resistances;

the first and second diodes being electrically connected at a first input juncture;

the third and fourth diodes being electrically connected at a second input juncture;

the AC signal being applied across the first and second input junctures;

the first and second diodes being electrically connected together with the first resistance, to provide a current path between a first and a second output juncture;

the third and fourth diodes being electrically connected together with the second resistance, to provide a current path between the first and second output junctures;

the rectified signal being provided across the first and second output junctures;

the second diode and the first resistance being electrically connected at a third output juncture, such that a first signal of predetermined polarity is generated at the third output juncture when the AC signal is a first polarity; and the third diode and the second resistance being electrically connected at a fourth output juncture, such that a second signal of predetermined polarity is generated at the fourth output juncture when the AC signal is a second polarity.

10. The circuit of claim 9 wherein the cathode of the second diode is electrically connected to the anode of the first diode at the first input juncture, and the cathode of the third diode is electrically connected to the anode of the fourth diode at the second input juncture.

11. The circuit of claim 10 wherein the anode of the second diode is electrically connected to the third output juncture, and the anode of the third diode is electrically connected to the fourth output juncture.

12. The circuit of claim 9, further comprising means for amplifying the first and second signals of predetermined polarity at a first gain level and a second gain level electrically coupled to the third and fourth output junctures.

13. The circuit of claim 12 wherein the means for amplifying includes:
- an operational amplifier including an input terminal and an output terminal, the input terminal being electrically coupled to third and fourth output junctures;
- a switch;
- a first feedback resistor; and
- a second feedback resistor, wherein the first feedback resistor is coupled between the output terminal of the operational amplifier and the input terminal of the operational amplifier, and the switch and the second feedback resistor are coupled in series between the output terminal and the input terminal.

14. A circuit for rectifying a first and a second AC signal, while generating indicia of the contemporaneous polarity of the AC signals, the circuit comprising:
  (1) a first rectifying element including:
  first, second, third, and fourth diodes; and
  first and second resistances,
  the first and second diodes being electrically connected at a first input juncture,
  the third and fourth diodes being electrically connected at a second input juncture,
  the first AC signal being applied across the first and second input junctures,
  the first and second diodes being electrically connected together with the first resistance, to provide a current path between a first and a second output juncture,
  the third and fourth diodes being electrically connected together with the second resistance, to provide a current path between the first and second output junctures,
  the rectified first AC signal being provided across the first and second output junctures,
  the second diode and the first resistance being electrically connected at a third output juncture, such that a first signal of predetermined polarity is generated at the third output juncture when the first AC signal is a first polarity, and
  the third diode and the second resistance being electrically connected at a fourth output juncture, such that a second signal of predetermined polarity is generated at the fourth output juncture when the first AC signal is a second polarity;
  (2) a second rectifying element including:
  fifth, sixth, seventh, and eight diodes; and
  third and fourth resistances,
  the fifth and sixth diodes being electrically connected at a third input juncture,
  the seventh and eighth diodes being electrically connected at a fourth input juncture,
  the second AC signal being applied across the third and fourth input junctures,
  the fifth and sixth diodes being electrically connected together with the third resistance, to provide a current path between a fifth and a sixth output juncture,
  the seventh and eighth diodes being electrically connected together with the fourth resistance, to provide a current path between the fifth and sixth output junctures,
  the rectified second AC signal being provided across the fifth and sixth output junctures,
  the sixth diode and the third resistance being electrically connected at a seventh output juncture, such that a third signal of predetermined polarity is generated at the seventh output juncture when the second AC signal is a first polarity, and
  the seventh diode and the fourth resistance being electrically connected at an eighth output juncture, such that a fourth signal of predetermined polarity is generated at the eighth output juncture when the second AC signal is a second polarity;
  (3) a first means for summing and amplifying the first and third signals of predetermined polarity at a first and a second gain level electrically coupled to the third and seventh output junctures; and
  (4) a second means for summing and amplifying the second and fourth signals of predetermined polarity at a third gain level and a fourth gain level electrically coupled to the fourth and eighth output junctures.

15. The circuit of claim 14 wherein the first means for summing and amplifying includes:
- an operational amplifier including a first input terminal and a first output terminal, the first input terminal being electrically coupled to the third and seventh junctures;
- a first switch;
- a first feedback resistor; and
- a second feedback resistor, wherein the first feedback resistor is coupled between the first output terminal and the first input terminal, and the first switch and the second feedback resistor are coupled in series between the first output and input terminals.

16. The circuit of claim 14 wherein the second means for summing and amplifying includes:
- an operational amplifier including a second input terminal and a second output terminal, the second input terminal being electrically coupled to the fourth and eighth junctures;
- a second switch;
- a third feedback resistor; and
- a fourth feedback resistor, wherein the third feedback resistor is coupled between the second output terminal and the second input terminal, and the second switch and the fourth feedback resistor are coupled in series between the second output and input terminals.

17. The circuit of claim 14 wherein the cathode of the second diode is electrically connected to the anode of the first diode at the first input juncture, the cathode of the third diode is electrically connected to the anode of the fourth diode at the second input juncture, the cathode of the sixth diode is connected to the anode of the fifth diode at the third input juncture, and the cathode of the seventh diode is connected to the anode of the eight diode at the fourth input juncture.

18. The circuit of claim 14, further comprising means for amplifying the first and second signals of predetermined polarity at a first gain level and a second gain level electrically coupled to the third and fourth output junctures.

19. The circuit of claim 18, further comprising means for amplifying the third and fourth signals of predetermined polarity at a third gain level and a fourth gain level electrically coupled to the seventh and eight output junctures.

* * * * *

UNITED STATES PATENT AND TRADEMARK OFFICE
CERTIFICATE OF CORRECTION

PATENT NO. : 4,947,126

DATED : August 7, 1990

INVENTOR(S) : May et al.

It is certified that error appears in the above-identified patent and that said Letters Patent is hereby corrected as shown below:

Cover Page Abstract
Section (57), line 3: delete "rectrifier" and in its place insert --rectifier--.

Column 3
Line 29: delete "coorporate" and in its place insert --cooperate--.

Signed and Sealed this

Twenty-second Day of October, 1991

Attest:

HARRY F. MANBECK, JR.

*Attesting Officer*  *Commissioner of Patents and Trademarks*